(12) United States Patent
Kim et al.

(10) Patent No.: US 8,283,851 B2
(45) Date of Patent: Oct. 9, 2012

(54) ORGANIC LIGHT-EMITTING DISPLAY APPARATUS

(75) Inventors: Young-Dae Kim, Suwon-si (KR); Kyoung-Bo Kim, Suwon-si (KR); Moo-Jin Kim, Suwon-si (KR); Cheol-Su Kim, Suwon-si (KR); Hye-Dong Kim, Suwon-si (KR); Ki-Ju Im, Suwon-si (KR); Yong-Sung Park, Suwon-si (KR); Gun-Shik Kim, Suwon-si (KR); Jun-Sik Oh, Suwon-si (KR); Brent Jang, Suwon-si (KR); Sang-Uk Kim, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 105 days.

(21) Appl. No.: 12/427,885

(22) Filed: Apr. 22, 2009

(65) Prior Publication Data
US 2010/0001639 A1   Jan. 7, 2010

(30) Foreign Application Priority Data
Jul. 6, 2008   (KR) .................................. 2008-69303

(51) Int. Cl.
*H05B 33/24* (2006.01)
(52) U.S. Cl. ................................... 313/504; 250/214 VT
(58) Field of Classification Search ............ 250/214 VT; 313/540
See application file for complete search history.

(56) References Cited

U.S. PATENT DOCUMENTS

| 2002/0011972 A1* | 1/2002 | Yamazaki et al. ........... 345/74.1 |
| 2004/0188687 A1 | 9/2004 | Arnold et al. |
| 2005/0212412 A1* | 9/2005 | Kurosawa et al. ............ 313/504 |
| 2005/0274988 A1* | 12/2005 | Hong .............................. 257/225 |
| 2007/0188085 A1* | 8/2007 | Young ............................. 313/506 |
| 2007/0229484 A1* | 10/2007 | Fujita et al. ................... 345/207 |
| 2007/0257254 A1 | 11/2007 | Yang et al. |

FOREIGN PATENT DOCUMENTS

| KR | 2003-0058719 | 7/2003 |
| KR | 10-2004-0085025 | 10/2004 |
| KR | 10-0762682 | 9/2007 |

OTHER PUBLICATIONS

Korean Office Action dated Mar. 9, 2010, issued in corresponding Korean Patent Application No. 10-2008-0069303.
Korean Registration Determination Certificate dated Sep. 8, 2010, issued in corresponding Korean Patent Application No. 10-2008-0069303.

* cited by examiner

*Primary Examiner* — Anh Mai
*Assistant Examiner* — Andrew Coughlin
(74) *Attorney, Agent, or Firm* — Christie, Parker & Hale, LLP

(57) ABSTRACT

An organic light-emitting display apparatus having a touch panel operation. The organic light-emitting display apparatus includes: a substrate; a display unit disposed on the substrate; an encapsulation substrate disposed above the display unit; a reflection layer formed on the substrate; and a photo sensor interposed between the reflection layer and the encapsulation substrate, and to detect light striking an object disposed on the encapsulation substrate.

20 Claims, 5 Drawing Sheets

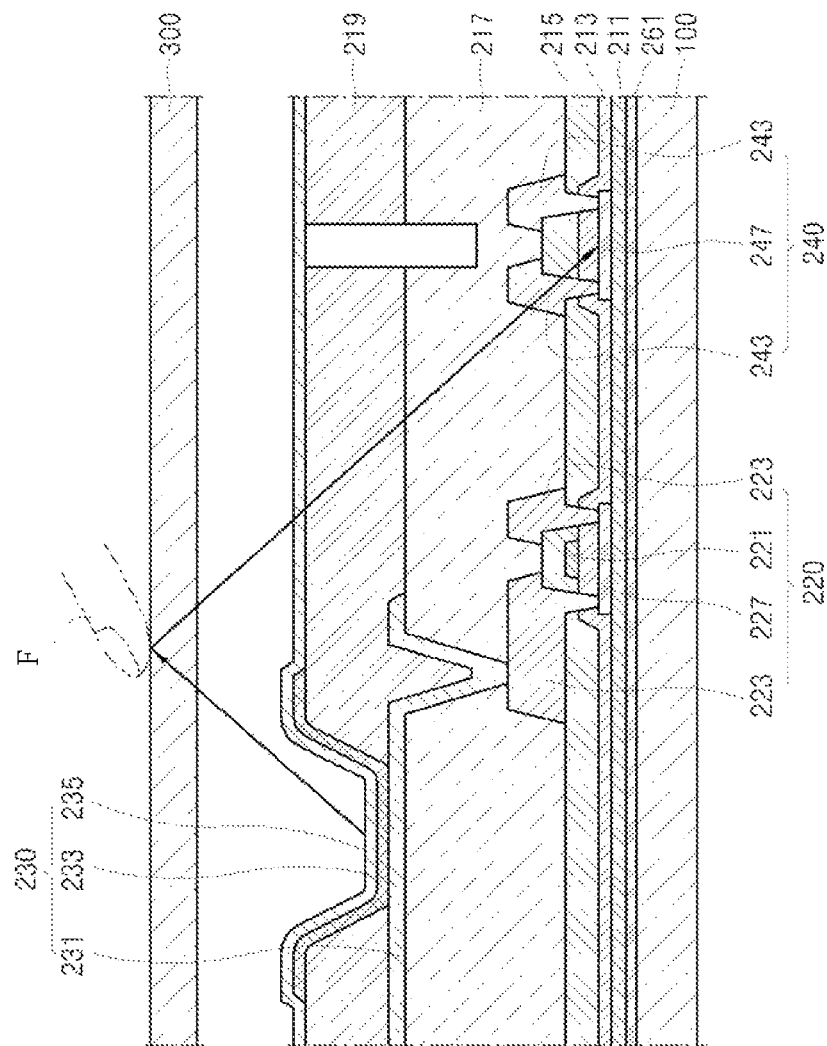

ORGANIC LIGHT-EMITTING DISPLAY APPARATUS

CROSS-REFERENCE TO RELATED APPLICATION

This application claims the benefit of Korean Patent Application No. 2008-69303, filed on Jul. 16, 2008, in the Korean Intellectual Property Office, the disclosure of which is incorporated herein, by reference.

BACKGROUND OF THE INVENTION

1. Field of the Invention

Aspects of the present invention relate to an organic light-emitting display apparatus that operates as a touch screen.

2. Description of the Related Art

Recently, conventional display devices are being replaced by light-weight, thin, flat panel display devices. Among the flat panel display devices, self-emissive electroluminescent display devices, which can be classified as organic or inorganic, have wide viewing angles, high contrast ratios, and high response speeds, are considered to be the next-generation of display devices. Organic light-emitting display devices have a light-emitting layer formed of an organic material, improved brightness, driving voltages, and response speeds, and can produce a larger range of colors, in comparison to inorganic light-emitting display devices.

Organic light-emitting display apparatuses having a touch panel operation have been recently developed. In one approach, a display screen having a touch operation has been mounted in an organic light-emitting display apparatus, so that a command can be input by touching the display screen. The touch panel display screen used in this case includes a photo sensor.

However, in an organic light-emitting display apparatus having a conventional touch panel operation, light cannot be sensed efficiently in a dark environment. To solve this problem, a method of sensing light using internal light, emitted by an organic light-emitting diode, has been developed. However, when the light emitted by the organic light-emitting diode is deflected by the touch of a user, most of the light is absorbed before striking the photo sensor, and thus, the light reception efficiency of the photo sensor is low. Accordingly, even though the user touches the display screen, the touch cannot be sensed, or a malfunction may be generated, thereby increasing product defects, and decreasing user convenience.

SUMMARY OF THE INVENTION

Aspects of the present invention provide an organic light-emitting display apparatus including a photo sensor having increased light reception efficiency, due to a reflection layer on a side of the photo sensor. Therefore, the light that is incident on the photo sensor and the light reflected from the photo sensor are both detected.

According to an aspect of the present invention, there is provided an organic light-emitting display apparatus comprising: a substrate; a display unit disposed on the substrate; an encapsulation substrate disposed facing the display unit; a reflection layer formed on a side of the substrate; and a photo sensor interposed between the reflection layer and the encapsulation substrate, to detect light striking an object disposed on the encapsulation substrate and reflected by the reflection layer.

According to an aspect of the present invention, light emitted from the display unit strikes an object pressed against the encapsulation substrate and is detected by the photo sensor. The light then travels through the photo sensor, is reflected by the reflection layer, and is then detected a second time by the photo sensor.

According to an aspect of the present invention, the reflection layer may be disposed directly below the photo sensor and may have substantially the same surface area as the photo sensor.

According to an aspect of the present invention, the reflection layer may cover the substrate.

According to an aspect of the present invention, the reflection layer may be formed on a surface of the substrate that faces away from the encapsulation substrate.

According to an aspect of the present invention, the reflection layer may comprise at least one of molybdenum (Mo), titanium (Ti), aluminium (Al), an AlNd alloy, and an AlNiLa alloy.

According to an aspect of the present invention, the reflection layer comprises stacked layers that are each formed of metal independently selected from molybdenum (Mo), titanium (Ti), aluminium (Al), an AlNd alloy, and an AlNiLa alloy.

According to another aspect of the present invention, there is provided an organic light-emitting display apparatus comprising: a thin film transistor formed on a substrate and comprising a semiconductor active layer, a gate electrode insulated on the semiconductor active layer, and source and drain electrodes adjacent to the semiconductor active layer; an optical detection transistor formed on a side of the thin film transistor and comprising a photo sensor, source and drain electrodes adjacent to the photo sensor, and a reflection layer; pixel electrodes formed on the thin film transistor and the optical detection transistor; pixel defining layers formed between the pixel electrodes; organic layers formed on the pixel electrodes and the pixel defining layers; and a counter electrode formed on the organic layers.

According to an aspect of the present invention, the reflection layer may be disposed between the substrate and the photo sensor.

According to an aspect of the present invention, light emitted from the organic layer may pass through the photo sensor, be reflected by the reflection layer, pass through the photo sensor again, and be emitted to the outside of the organic light-emitting display apparatus.

According to an aspect of the present invention, the light may be detected by the photo sensor every time the light passes through the photo sensor.

According to an aspect of the present invention, the thin film transistor and the optical detection transistor may be sequentially disposed.

According to an aspect of the present invention, the reflection layer may comprise at least one of molybdenum (Mo), titanium (Ti), aluminium (Al), an AlNd alloy, and an AlNiLa alloy.

According to an aspect of the present invention, the reflection layer may be formed by stacking at least one of molybdenum (Mo), titanium (Ti), aluminium (Al), an AlNd alloy, and n AlNiLa alloy, as multiple layers.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which:

FIG. 6 is a plan view illustrating a portion of an organic light-emitting display apparatus, according to another embodiment of the present invention.

DETAILED DESCRIPTION OF THE EXEMPLARY EMBODIMENTS

Figure 1:
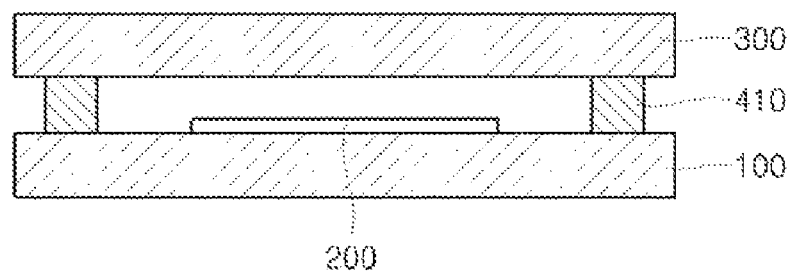
FIG. 1 is a plan view illustrating a portion of an organic light-emitting display apparatus, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Figure 2:
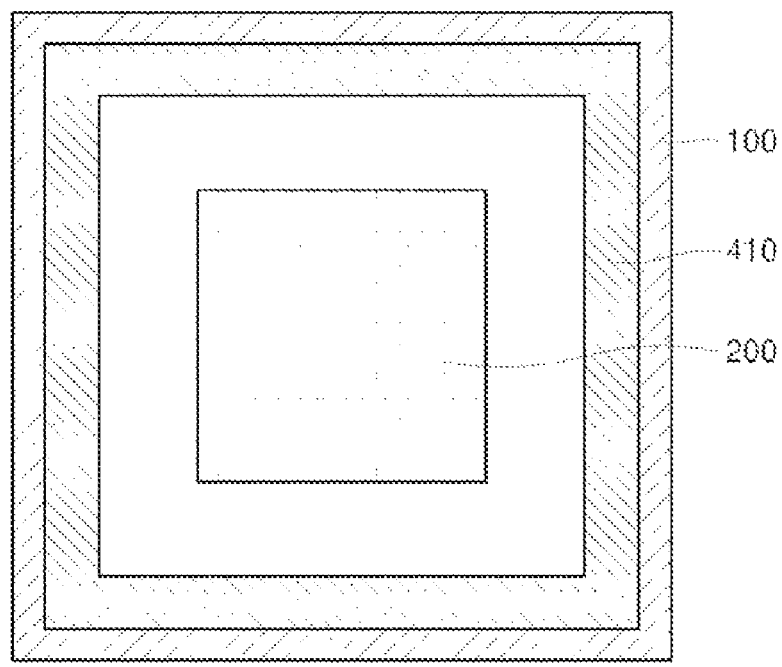
FIG. 2 is a cross-sectional view illustrating the organic light-emitting display apparatus of FIG. 1.

FIG. 1 is a plan view illustrating a portion of an organic light-emitting display (OLED) apparatus, according to an exemplary embodiment of the present invention, and FIG. 2 is a cross-sectional view illustrating the organic light-emitting display apparatus of FIG. 1. In FIG. 2, an encapsulation substrate 300 illustrated in FIG. 1, is not shown.

Referring to FIGS. 1 and 2, a display unit 200 comprising organic light-emitting diodes is formed on a substrate 100. The substrate 100 may be formed of a transparent glass containing $SiO_2$ as a main component, but is not limited thereto. For example, the substrate may also be formed of a transparent plastic material, such as an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

In a bottom emission-type OLED apparatus, in which an image is projected through the substrate 100, the substrate 100 is preferably formed of a transparent material. However, in a top emission-type OLED apparatus, in which an image is projected away from the substrate 100, the substrate 100 may be formed of a reflective material, such as a metal. When the substrate 100 is formed of a metal, the substrate 100 may include at least one material selected from the group consisting of carbon (C), iron (Fe), chromium (Cr), manganese (Mg), nickel (Ni), titanium (Ti), molybdenum (Mo), stainless steel (SUS), Invar alloys, Inconel alloys, and Kovar alloys. However, the present invention is not limited to the above examples. For example, the substrate 100 may also be formed of a metal foil.

Although not illustrated in the drawings, in the case of a bottom emission-type OLED apparatus, a buffer layer may be further formed on a top surface of the substrate 100, to planarize the substrate 100 and to prevent the diffusion of impurities.

The substrate 100 and the attached display unit 200 are attached to an encapsulation substrate 300, which faces the display unit 200. The encapsulation substrate 300 may be formed of a glass material, various plastic materials such as acryl, or a metal, for example.

The substrate 100 and the encapsulation substrate 300 are attached to each other using a sealant 410. The sealant 410 may be a glass frit, as generally used in the art. Alternatively, the sealant 410 may be an organic sealant, an inorganic sealant, an organic/inorganic hybrid sealant, or a mixture thereof.

Figure 3:
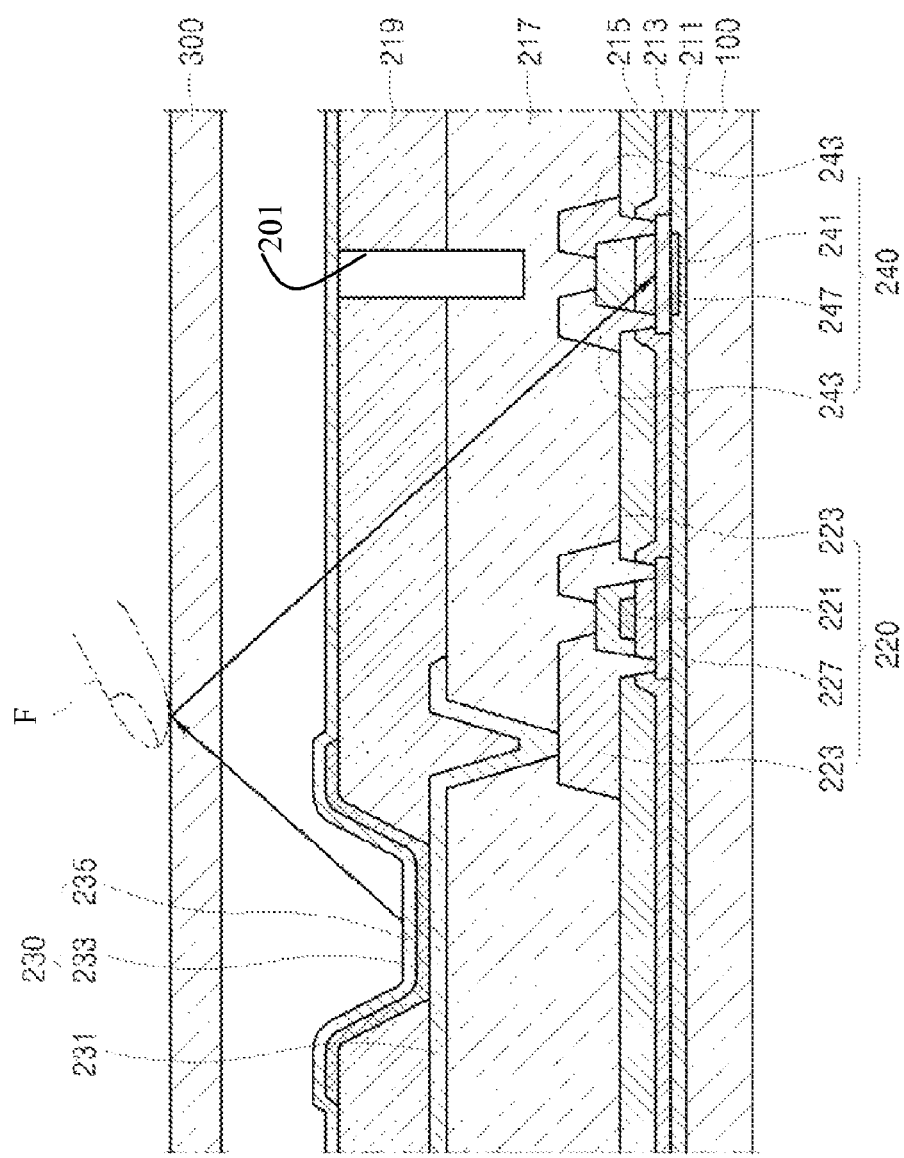
FIG. 3 is a cross-sectional view illustrating a portion of the organic light display emitting apparatus of FIG. 1.

FIG. 3 is a cross-sectional view illustrating the organic light-emitting display apparatus of FIG. 1, showing a portion of the display unit 200 in detail. The display unit includes a plurality of light-emitting diodes, thin film transistors, and photo sensors. Referring to FIG. 3, one thin film transistor 220 and one photo sensor 240 are disposed on the substrate 100. An organic light-emitting diode 230 is formed over the thin film transistor 220 and the photo sensor 240.

The thin film transistors 220 includes a gate electrode 221, source and drain electrodes 223, a semiconductor layer 227, a gate insulating layer 213, and an interlayer insulating layer 215, and is formed on the substrate 100. Various other types of thin film transistors, such as an organic thin film transistor including a semiconductor layer formed of an organic material, or a silicon thin film transistor may also be used. A buffer layer 211 formed of a silicon oxide or a silicon nitride may be further formed between the thin film transistor 220 and the substrate 100.

The photo sensor 240 comprises source and drain electrodes 243, and an optical detection transistor 247. A gate insulating layer 213, an interlayer insulating layer 215, and a reflection layer 241 are disposed around the photo sensor 240. The photo sensor 240 will be described in detail later.

The organic light-emitting diode 230 comprises a pixel electrode 231, an opposing counter electrode 235, and an intermediate layer 233 formed of an organic material and interposed therebetween. The intermediate layer 233, includes at least one light-emitting layer, and may also include a plurality of layers, as will be described later. The pixel electrode 231 can operate as an anode, and the counter electrode 235 can operate as a cathode electrode, or vice versa.

The pixel electrode 231 may be formed as a transparent electrode or a reflective electrode. When formed as a transparent electrode, the pixel electrode 231 may be formed of indium tin oxide (ITO), indium zinc oxide (IZO), ZnO, or $In_2O_3$. When formed as a reflective electrode, the pixel electrode 231 may include a reflective layer formed of Ag, Mg, Al, Pt, Pd, Au, Ni, Nd, Ir, Cr, or a combination thereof, and a layer formed of ITO, IZO, ZnO, or $In_2O_3$, can be formed on the reflective layer.

The counter electrode 235 may also be formed as a transparent electrode or a reflective electrode. When formed as a transparent electrode, the counter electrode 235 may include a layer comprising Li, Ca, LiF/Ca, LiF/Al, Al, Mg, or a compound thereof, deposited on the intermediate layer 233, and may also include a bus electrode line or an auxiliary electrode formed of ITO, IZO, ZnO, or $In_2O_3$. When formed as a reflective electrode, the counter electrode 235 may be formed of Li, Ca, LiF/Ca, LiF/Al, Al, Mg, or a combination thereof.

A pixel defining layer (PDL) 219 is formed to cover the edges of the pixel electrode 231, so as to define a light-emitting region. The PDL 219 separates the counter electrode 235 from the pixel electrode 231, by a distance corresponding to the thickness of the PDL 219. Accordingly, the concentration of an electric field on the edges of the pixel electrode 231 is prevented, thereby preventing a short circuit between the pixel electrode 231 and the counter electrode 235.

The intermediate layer 233 includes a light-emitting layer and may be formed between the pixel electrode 231 and the counter electrode 235. The intermediate layer 233 may include other layers in addition to the light-emitting layer. In the present exemplary embodiment, the intermediate layer 233 may be formed of a small molecule organic material, or a polymer organic material.

When formed of a small molecule organic material, the intermediate layer 233 may have a single-layer or multiple-layer structure, in which a hole injection layer (HIL), a hole transport layer (HTL), an organic light emission layer (EML), an electron transport layer (ETL), and an electron injection layer (EIL) are stacked. Examples of the organic material include copper phthalocyanine (CuPc), N,N'-Di(naphtha-lene-1-yl)-N,N'-diphenyl-benzidine (NPB), tris-8-hydrox-yquinoline aluminum (Alq3), and the like. The small molecule organic material may be formed by vacuum deposition, using a mask.

When formed of a polymer organic material, the intermediate layer 233 may have a structure formed of an HTL and an EML. The HTL may be formed of poly(3,4-ethylenediox-ythiophene) (PEDOT), and the EML may be formed of poly-phenylenevinylene (PPV) and polyfluorene.

The organic light-emitting diode 230 is electrically connected to the thin film transistor 220. When a planarization layer 217 is formed to cover the thin film transistor 220, the organic light-emitting diode 230 is disposed on the planarization layer 217. The pixel electrode 231 of the organic light-emitting diode 230 is electrically connected to the thin film transistor 220, via a contact hole formed in the planarization layer 217.

The organic light-emitting diode 230 is sealed by the encapsulation substrate 300. The encapsulation substrate 300 may be formed of various materials, such as glass or plastic, as described above.

The organic light-emitting display apparatus comprises a reflection layer 241 disposed between the photo sensor 240 and the substrate 100. Light emitted by the intermediate layer 233 strikes an object on the encapsulation substrate 300, such as the finger F of a user, and is then detected by the photo sensor 247. At least some of the light passes through the photo sensor 240 and is reflected by the reflection layer 241, back to the photo sensor 240, and is then detected a second time. Thus, the light is detected twice, before being emitted to the outside. Accordingly, the light reception efficiency of the photo sensor 240 is significantly increased.

In detail, in a conventional organic light-emitting display apparatus having a touch panel function, light cannot be efficiently sensed when ambient light levels are low. To solve this and/or other problems, a method, of using internal light emitted from the organic light-emitting diode to sense light, has been developed. However, when the light emitted from the organic light-emitting diode strikes an object, most of the light is absorbed before reaching a photo sensor.

Accordingly, the amount of light arriving at the photo sensor is not sufficient, and thus, the light reception efficiency of the photo sensor is too low to be reliable. As a result, the touch cannot be sensed, or a malfunction can be generated, thereby increasing the product defect ratio and decreasing user convenience. To solve this and/or other problems, the organic light-emitting display apparatus, according to the first exemplary embodiment of the present invention, comprises the reflection layer 241 between the photo sensor 240 and the substrate 100.

The reflection layer 241 is formed on the substrate 100. The reflection layer 241 may be formed of a metal having good reflectivity. Examples of the material for the reflection layer 241 include molybdenum (Mo), titanium (Ti), aluminum (Al), an AlNd alloy, an AlNiLa alloy, or the like. However, any material having good light reflectivity may be used as a reflection layer. The reflection layer 241 may include multiple layers comprising at least one of the above materials, instead of one single layer.

The photo sensor 240 is formed on the substrate 100 and the reflection layer 241. The photo sensor 240 may be one of the various photo sensors used in touch panels. An opening 201 may be formed in the planarization layer 217 and the pixel defining layer 219, above the photo sensor 240. The opening 201 can reduce a drop in sensitivity of the photo sensor 240, resulting from light being absorbed by various layers of the organic light-emitting display apparatus. The opening 201 can also increase the ambient light absorption ration of the photo sensor 240, when the photo sensor operates using ambient light.

The gate insulating layer 213 and the interlayer insulating layer 215 are sequentially stacked on the photo sensor 240. After contact holes are formed in the gate insulating layer 213 and the interlayer insulating layer 215, the source and drain electrodes 243 are formed in the contact holes.

The light reception efficiency of the photo sensor 240 can be increased with the above configuration. In detail, internal light emitted from the organic light-emitting diode 230 is used to detect objects in a dark environment. To this end, as illustrated in FIG. 3, light emitted from the intermediate layer 233, particularly, from an organic light emission layer (EML), strikes the finger F of the user, which contacts the encapsulation substrate 300, and is detected by the optical detection transistor 247 of the photo sensor 240. This light passes through the photo sensor 247 and is then reflected by the reflection layer 241, back to the photo sensor 240. The light passes through the photo sensor 240 twice, and thus, the detection efficiency of the photo sensor 240 is improved.

Figure 4:
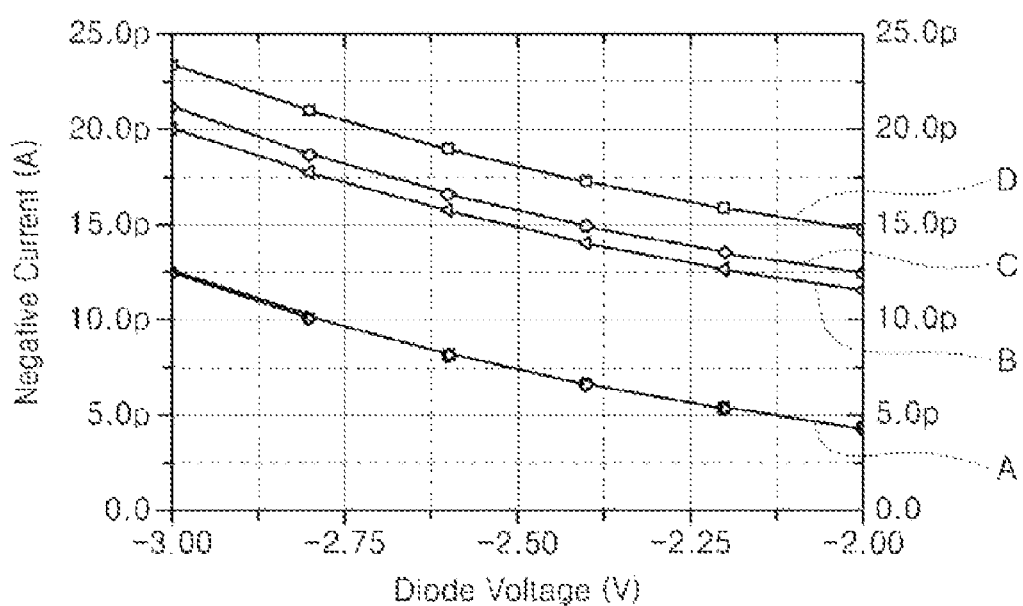
FIG. 4 is a graph showing the effect of using a reflection layer in the organic light-emitting display apparatus of FIG. 1.

FIG. 4 is a graph showing the effect of using a reflection layer in the organic light-emitting display apparatus of FIG. 1. In FIG. 4, the X axis denotes a driving voltage of a photo sensor, and the Y axis denotes a current read by the photo sensor. Line A refers to a case where light is not applied to the photo sensor, and Line B refers to a case where a light of 1000 Lux is applied to the photo sensor, when no reflection layer is formed on a side of the photo sensor. Line C refers to a case where a light of 1000 Lux is applied, when a reflection layer formed of Mo is disposed on a side of the photo sensor, and Line D refers to a case where a light of 1000 Lux is applied, when a reflection layer formed of Al is disposed on a side of the photo sensor.

Referring to FIG. 4, assuming that the driving voltage of the photo sensor (the X axis) is regular, the current read by the photo sensor is greater when a reflection layer is formed on a side of the photo sensor (Lines C and D) than when no reflection layer is formed on a side of the photo sensor (Line B). That is, at an identical amount of light, the photo sensor reacts more when a reflection layer is formed on a side of the photo sensor, and the light reception efficiency of the photo sensor is also increased. As the light reception efficiency of the photo sensor is increased, product malfunctions or defects are reduced, and user convenience is increased.

Figure 5:
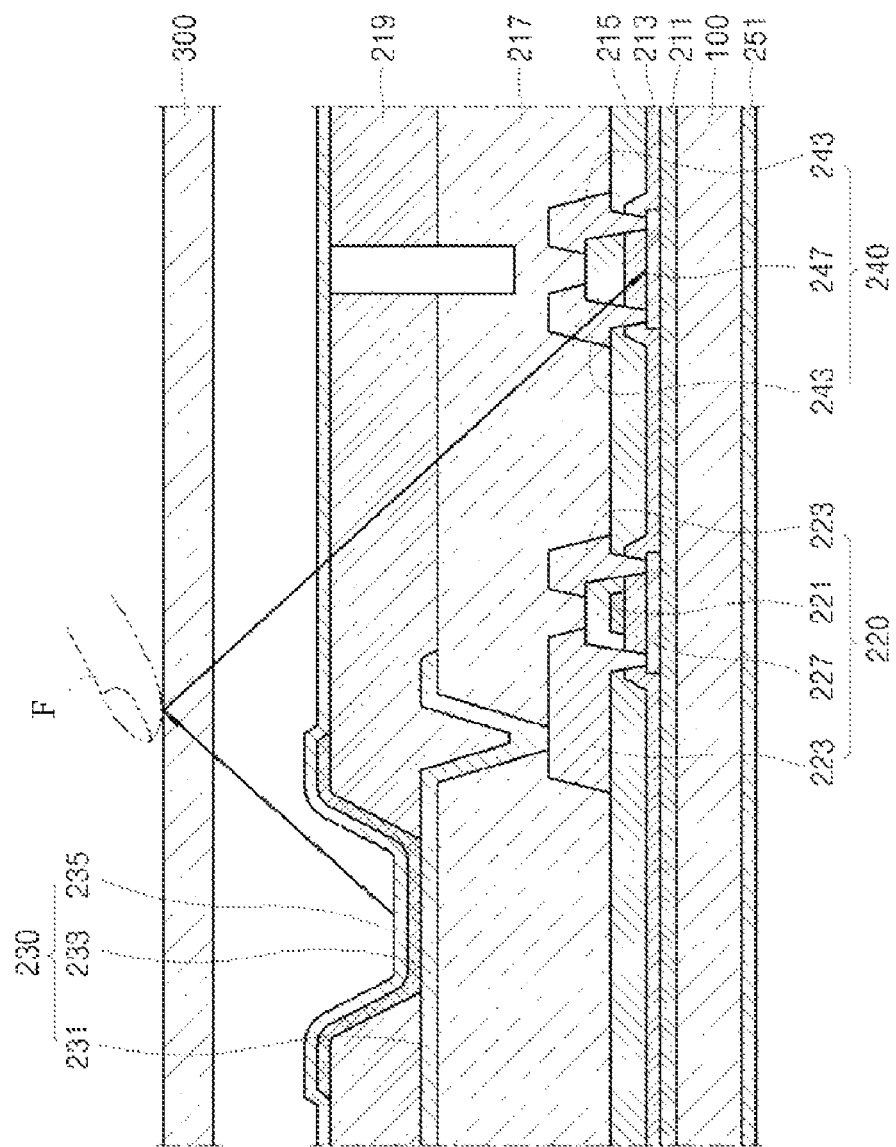
FIG. 5 is a plan view illustrating a portion of an organic light-emitting display apparatus, according to another embodiment of the present invention.

FIG. 5 is a plan view illustrating a portion of an organic light-emitting display apparatus, according to another exemplary embodiment of the present invention. Referring to FIG. 5, a plurality of thin film transistors 220 and photo sensors 240 are formed on a substrate 100. An organic light-emitting diode 230 is formed on the thin film transistors 220 and the photo sensors 240. The organic light-emitting diode 230 comprises pixel electrodes 231 that are electrically connected to the thin film transistors 220, a counter electrode 235 that covers the substrate 100, and intermediate layers 233 disposed between the pixel electrodes 231 and the counter electrode 235. The intermediate layers 233 each include at least one light-emitting layer.

The organic light-emitting display apparatus of the current exemplary embodiment is different from that of the previous exemplary embodiment, in that a reflection layer 251 is formed below the substrate 100. That is, the elements described with reference to the previous embodiment may be formed on the substrate 100, after the reflection layer 251 is formed below the substrate 100. Examples of the materials of the reflection layer 251 include molybdenum (Mo), titanium (Ti), aluminum (Al), an AlNd alloy, an AlNiLa alloy, and any other material having a suitable reflectivity. Also, the reflection layer 251 may include multiple stacked layers comprising at least one of the above materials, instead of one single layer formed of one of the above materials. Alternatively, the reflection layer 251 may be formed below the substrate 100, in the form of a bezel.

As described above, because the reflection layer 251 is deposited on a lower surface of the substrate 100, a patterning process for forming a reflection layer is not required. Thus, the manufacturing process thereof is simplified, and the manufacturing costs can be reduced.

FIG. 6 is a plan view illustrating a portion of an organic light-emitting display apparatus, according to another exemplary embodiment of the present invention. Referring to FIG. 6, a plurality of thin film transistors 220 and photo sensors 240 are formed on a substrate 100. An organic light-emitting diode 230 is formed on the thin film transistors 220 and the photo sensors 240. The organic light-emitting diode 230 comprises: pixel electrodes 231 that are electrically connected to each of the thin film transistors 220; a counter electrode 235 covering the substrate 100; and intermediate layers 233 disposed between the pixel electrodes 231 and the counter electrode 235. The intermediate layers 223 each include least one light-emitting layer.

The organic light-emitting display apparatus of the current exemplary embodiment is different from that of the previous exemplary embodiments, in that a reflection layer 261 is formed between the substrate 100 and the photo sensors 240, which completely covers a surface of the substrate 100. That is, the elements described with reference to the previous embodiment may be formed on the substrate 100, after the reflection layer 261 is deposited, so as to completely cover a surface of the substrate 100. In the alternative, a reflection layer in the form of a film is used to cover the substrate 100. Examples of the materials of the reflection layer 261 include molybdenum (Mo), titanium (Ti), aluminum (Al), an AlNd alloy, an AlNiLa alloy, and the like. The reflection layer 261 may include multiple stacked layers, each comprising at least one of the above materials, instead of a single layer formed of one of the above materials.

As described above, because the reflection layer 261 completely covers a surface of the substrate 100, the reflection layer 261 need not be patterned. Thus, the manufacturing process thereof is simplified, and the manufacturing costs can be reduced. As described above, the light reception efficiency of a photo sensor is increased, and thus, product malfunctions and defects can be reduced, and user convenience can be increased.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting display apparatus comprising:
   a substrate;
   a display unit on the substrate;
   an encapsulation substrate facing the substrate;
   a reflection layer on the substrate; and
   a photo sensor between the reflection layer and the encapsulation substrate, to detect light striking an object positioned on the encapsulation substrate and light reflected by the reflection layer,
   wherein when light emitted from the display unit strikes an object, at least some of said light having a first wavelength is detected by the photo sensor, while at least some of said light having the first wavelength that is not initially detected by the photo sensor passes through the photo sensor to the reflection layer and is then reflected by the reflection layer back towards the photo sensor for detection.

2. The organic light-emitting display apparatus of claim 1, wherein the reflection layer faces the photo sensor and has substantially the same surface area as the photo sensor.

3. The organic light-emitting display apparatus of claim 1, wherein the reflection layer completely covers a surface of the substrate.

4. The organic light-emitting display apparatus of claim 1, wherein the reflection layer is formed on a surface of the substrate that faces away from the encapsulation substrate.

5. The organic light-emitting display apparatus of claim 1, wherein the reflection layer comprises at least one of molybdenum (Mo), titanium (Ti), aluminium (Al), an AlNd alloy, and an AlNiLa alloy.

6. The organic light-emitting display apparatus of claim 5, wherein the reflection layer comprises stacked layers that are each formed of a material independently selected from the group consisting of molybdenum (Mo), titanium (Ti), aluminium (Al), an AlNd alloy, and an AlNiLa alloy.

7. An organic light-emitting display apparatus comprising:
   a substrate;
   thin film transistors on the substrate, each comprising:
      a semiconductor active layer,
      a gate electrode on and insulated from the semiconductor active layer, and
      source and drain electrodes connected to the semiconductor active layer;
   a photo sensor positioned adjacent to each of the thin film transistors, each photo sensor comprising:
      an optical detection transistor, and
      source and drain electrodes connected to the optical detection transistor;
   a reflection layer to reflect light to the photo sensor;
   pixel electrodes connected to the thin film transistors;
   a pixel defining layer on the substrate, having apertures to expose the pixel electrodes;
   organic layers in the apertures, on the pixel electrodes; and
   a counter electrode on the organic layers, wherein when light emitted from the organic layer strikes an object contacting the organic light-emitting apparatus, at least some of said light having a first wavelength is detected by the photo sensor while at least some of said light having the first wavelength that is not initially detected by the photo sensor passes through the photo sensor to the reflection layer and is then reflected by the reflection layer back towards the photo sensor a second time for detection.

8. The organic light-emitting display apparatus of claim 7, wherein the reflection layers are disposed between the substrate and the photo sensors.

9. The organic light-emitting display apparatus of claim 7, wherein the organic light-emitting display apparatus is configured such that when some of said light having the first wavelength passes through the photo sensor a second time and remains undetected, the remaining undetected light is emitted to the outside of the organic light-emitting display apparatus.

10. The organic light-emitting display apparatus of claim 7, wherein the organic light-emitting display apparatus is configured such that at least a portion of said light is detected by the photo sensor each time the light passes through the photo sensor.

11. The organic light-emitting display apparatus of claim 7, wherein the thin film transistors and the photo sensors are alternately disposed on the substrate.

12. The organic light-emitting display apparatus of claim 7, wherein the reflection layer comprises at least one of molybdenum (Mo), titanium (Ti), aluminium (Al), an AliNd alloy, and an AlNiLa alloy.

13. The organic light-emitting display apparatus of claim 12, wherein the reflection layer comprises stacked layers that are each formed of a material independently selected from molybdenum (Mo), titanium (Ti), aluminium (Al), an AlNd alloy, and an AlNiLa alloy.

14. An organic light-emitting display apparatus comprising:
a substrate;
an encapsulating substrate facing the substrate;
thin film transistors on the substrate;
organic light-emitting diodes connected to the thin film transistors, to project light toward the encapsulating substrate;
photo sensors on the substrate, adjacent to each of the thin film transistors, to detect at least some of the light having a first wavelength that is emitted by the organic light-emitting diodes and that strikes an object on the encapsulating substrate; and
a reflection layer on the substrate, to reflect at least some of the light having the first wavelength that is not initially detected by the photo sensors back towards the photo sensors to be detected by the photo sensors.

15. The organic light-emitting apparatus of claim 14, wherein the reflection layer is disposed directly on a surface of the substrate that faces the photo sensors.

16. The organic light-emitting apparatus of claim 14, wherein the reflection layer is disposed directly on a surface of the substrate that faces away from the photo sensors.

17. The organic light-emitting apparatus of claim 14, wherein the reflection layer comprises a plurality of separate layers that are each disposed between a respective one of the photo sensors and the substrate.

18. The organic light-emitting apparatus of claim 14, wherein the reflection layer comprises at least one of molybdenum (Mo), titanium (Ti), aluminium (Al), an AlNd alloy, and an AlNiLa alloy.

19. The organic light-emitting apparatus of claim 14, wherein at least some of said light striking the object is configured to pass through the photo sensors at least two times.

20. The organic light-emitting apparatus of claim 14, wherein the reflection layer completely covers a surface of the substrate.

* * * * *